United States Patent [19]
Gill, Jr.

[11] Patent Number: 5,224,007
[45] Date of Patent: Jun. 29, 1993

[54] CURRENT WINDOW DETECTION CIRCUIT

[75] Inventor: Harry A. Gill, Jr., Cupertino, Calif.

[73] Assignee: Raytheon Company, Lexington, Mass.

[21] Appl. No.: 918,139

[22] Filed: Jul. 23, 1992

Related U.S. Application Data

[63] Continuation of Ser. No. 634,677, Dec. 27, 1990, abandoned.

[51] Int. Cl.[5] .............................. H02H 3/26
[52] U.S. Cl. ...................... 361/45; 361/93; 323/316
[58] Field of Search ............ 361/42, 45, 49, 78, 361/87, 93, 102; 323/315, 316, 317; 363/60, 61, 63

[56] References Cited

U.S. PATENT DOCUMENTS

| | | | |
|---|---|---|---|
| 3,953,766 | 4/1976 | Howell et al. | 361/42 |
| 4,114,089 | 9/1978 | Ahmed | 361/44 |
| 4,180,841 | 12/1979 | Engel | 361/45 |
| 4,965,510 | 10/1990 | Kriedt et al. | 323/315 |
| 5,057,792 | 10/1991 | Gay | 323/315 |

OTHER PUBLICATIONS

Data Sheet "LM1851 Ground Fault Interrupter", Linear Integrated Circuits 1989, Raytheon Company Semiconductor Division, Mountain View, Calif.

Primary Examiner—Todd E. DeBoer
Assistant Examiner—Ronald W. Leja
Attorney, Agent, or Firm—William R. Clark; Richard M. Sharkansky

[57] ABSTRACT

A ground fault interrupt circuit with an improved current window detector. The current window detector works by first rectifying the input current in a pair of current mirrors connected in back to back fashion in the feedback path of the input amplifier. The rectified current triggers an output when the rectified current exceeds a predetermined threshold.

8 Claims, 6 Drawing Sheets

CURRENT WINDOW DETECTION CIRCUIT

This application is a continuation of application Ser. No. 634,677 filed Dec. 27, 1990, now abandoned.

BACKGROUND OF THE INVENTION

This invention relates generally to circuits for measuring current and, more particularly, circuits to sense when a current falls outside a predetermined range.

In many instances, it is desirable to know that the level of a current is within acceptable limits. One important instance where the value of a current is very important is in a ground fault interrupt (GFI) circuit. These circuits are used to reduce the chance that a person will receive a serious electrical shock from an electrical appliance dropped into water or otherwise malfunctioning.

A GFI circuit operates by sensing the current on the power line leading up to the appliance. The power line has two wires. When the electrical appliance is operating correctly, the current in each wire is equal since all the current supplied in one of the wires returns in the other wire.

If some of the current supplied to the electrical appliance is flowing out of the appliance, a dangerous condition exists. For example, when an appliance drops into water, current may flow out of the appliance and shock a person. To avoid this unpleasant result, GFI circuits sense that more current is flowing into the electrical appliance than is flowing back from the appliance. Then the GFI circuit disconnects all power from the electrical appliance.

Circuits to sense currents are commercially available. For example, National Semiconductor manufactures and sells an integrated circuit chip designated LM1851. The circuit is designed to be connected to the secondary of a transformer. The primary of the transformer is made from both wires of the power line to the appliance. If there is an imbalance in the current in the two wires, there will be a current induced in the secondary winding.

For the transformer to accurately reflect the imbalance of current in the primary to the secondary, the impedance in the secondary must be very low. Thus, the impedance of the circuit to sense currents must be very low, typically less than 100 ohms. Also, the circuit to sense current must be able to tell when the magnitude of the current exceeds a threshold, regardless of the direction of the current.

While the LM1851 performs adequately, it is desirable to have a circuit which is as simple as possible to sense current. A simpler circuit is less expensive to fabricate and less likely to fail.

Also, the LM1851 contains an amplifier with zener diodes in a feedback loop. The zener diodes convert the current at the input of the LM1851 to a voltage for sensing. If the voltage exceeds a threshold, a fault condition is indicated. However, because the LM1851 operates by converting a current to a voltage, its supply voltage must be above a certain level. It would be desirable in some circumstances to build a current sense circuit to operate at lower voltages, say as low as 3 volts or less.

SUMMARY OF THE INVENTION

With the foregoing background in mind, it is an object of this invention to provide a current window detection circuit that is simple to construct.

It is also an object of this invention to provide a current window detection circuit that can operate with a very low supply voltage, say less than 3 volts.

It is yet a further object of this invention to provide a GFI circuit with an improved current window detection circuit.

The foregoing and other objects are achieved in a GFI chip with a current window detection circuit. The current window detection circuit comprises two back-to-back current mirrors in the feedback path of a sense amplifier which receives the current input. A third current mirror reflects the current through either of the first two current mirrors to the input node of a comparator. When the current at the input node of the comparator exceeds a threshold current, the output of the comparator signals a fault condition.

BRIEF DESCRIPTION OF THE DRAWINGS

The foregoing objects will be better understood by reference to the following more detailed description and accompanying drawings in which.

DESCRIPTION OF THE PREFERRED EMBODIMENTS

Figure 1:
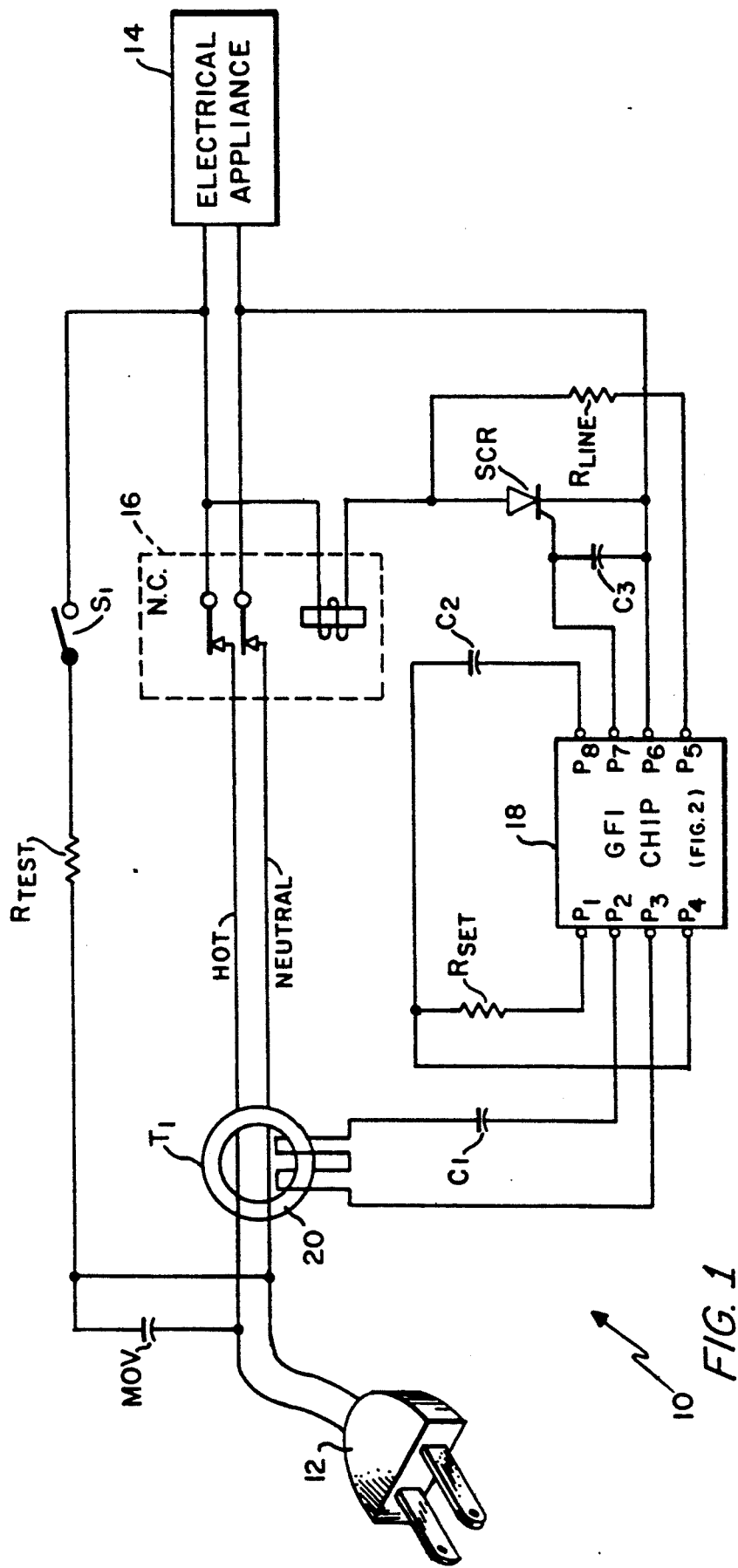
FIG. 1 is a schematic diagram of an electrical appliance protected with a GFI circuit.

FIG. 1 shows a schematic of an electrical appliance 14 protected by a Ground Fault Interrupt (GFI) circuit 10. As shown in FIG. 1, GFI circuit 10 is incorporated into the cord 12 supplying power to electrical appliance 14. Electrical appliance 14 may be any electrical appliance such as a hair dryer, curling iron, or electric drill.

GFI circuit 10 includes a GFI chip 18 coupled to power cord 12 through transformer $T_1$. As shown in FIG. 1, power cord 12 consists of a HOT wire and a NEUTRAL wire. Both the HOT wire and the NEUTRAL wire pass through core 20 of transformer $T_1$. The HOT and NEUTRAL wires thus form the single turn primary of transformer $T_1$. If the current flow through the HOT and NEUTRAL wires becomes unequal, a current will be induced in the secondary of transformer $T_1$. Here, transformer $T_1$ has a turns ratio of 1:500. Thus, the secondary current ideally is the imbalance of the current through the HOT and NEUTRAL wires divided by 500. However, this current relationship only holds if the impedance between pins $P_2$ and $P_3$ of GFI chip 18 is low. Here, the impedance is on the order of 1 ohm, as compared to approximately 1000 of prior art devices.

As in a conventional GFI circuit, an unequal current in wires HOT and NEUTRAL may signify a dangerous condition involving electrical appliance 14. GFI chip 18 senses the current flow in the secondary of transformer $T_1$ and actuates normally closed relay 16 when the current in the secondary of transformer $T_1$ indicates the possibility of a failure involving electrical appliance 14.

Relay 16, when actuated, disconnects power to electrical appliance 14. The chance of personal injury as a result of the failure involving electrical appliances is therefore greatly reduced. Relay 16 is preferably the type of relay conventionally found in circuit breakers which, once open, must be manually closed.

FIG. 1 shows that GFI chip 18 is connected to relay 16 through a silicon controlled rectifier SCR. As is known, a silicon control rectifier is used as a latching current switch. Capacitor $C_3$ acts as a filter to prevent noise from triggering the silicon controlled rectifier SCR.

Capacitor $C_2$ is used as a filter to prevent electrical noise from interfering with the operation of GFI circuit 10.

Capacitor $C_1$ is used to ac couple the current in the secondary of transformer $T_1$ into GFI chip 18.

Resistor $R_{LINE}$ connects GFI chip 18 to the HOT wire. $R_{LINE}$ provides power to GFI chip 18.

Resistor $R_{TEST}$ and switch $S_1$ allow, as in prior devices, a test of the operation of GFI circuit 10. The MOV acts, as in prior devices, to protect GFI circuit 18 and electrical appliance 14 from voltage spikes.

As described above, GFI chip 18 senses the current between pins $P_2$ and $P_3$. If that current is large enough that it signals a fault involving electrical appliance 14, GFI chip 18 produces a signal at pin $P_7$ which actuates relay 16. The level of current between pins $P_2$ and $P_3$ which is large enough to cause GFI chip 18 to actuate relay 16 is determined by the value of resistor $R_{SET}$. Smaller values of $R_{SET}$ require a greater imbalance of the current on lines HOT and NEUTRAL before relay 16 is actuated.

GFI chip 18 differs from prior art devices in its internal circuitry used to detect when the current between pins $P_2$ and $P_3$ exceeds a current threshold. Such a circuit is called a current window detector. The current window detector must produce a signal indicating that the magnitude of current in the secondary of transformer $T_1$ exceeds a set threshold. It will be appreciated from FIG. 1 that power cord 12 supplies alternating current and, consequently, the polarity of the current in the secondary of transformer $T_1$ periodically reverses. Thus, the current window detector must sense a current having a magnitude exceeding the threshold, regardless of its polarity.

Figure 2:
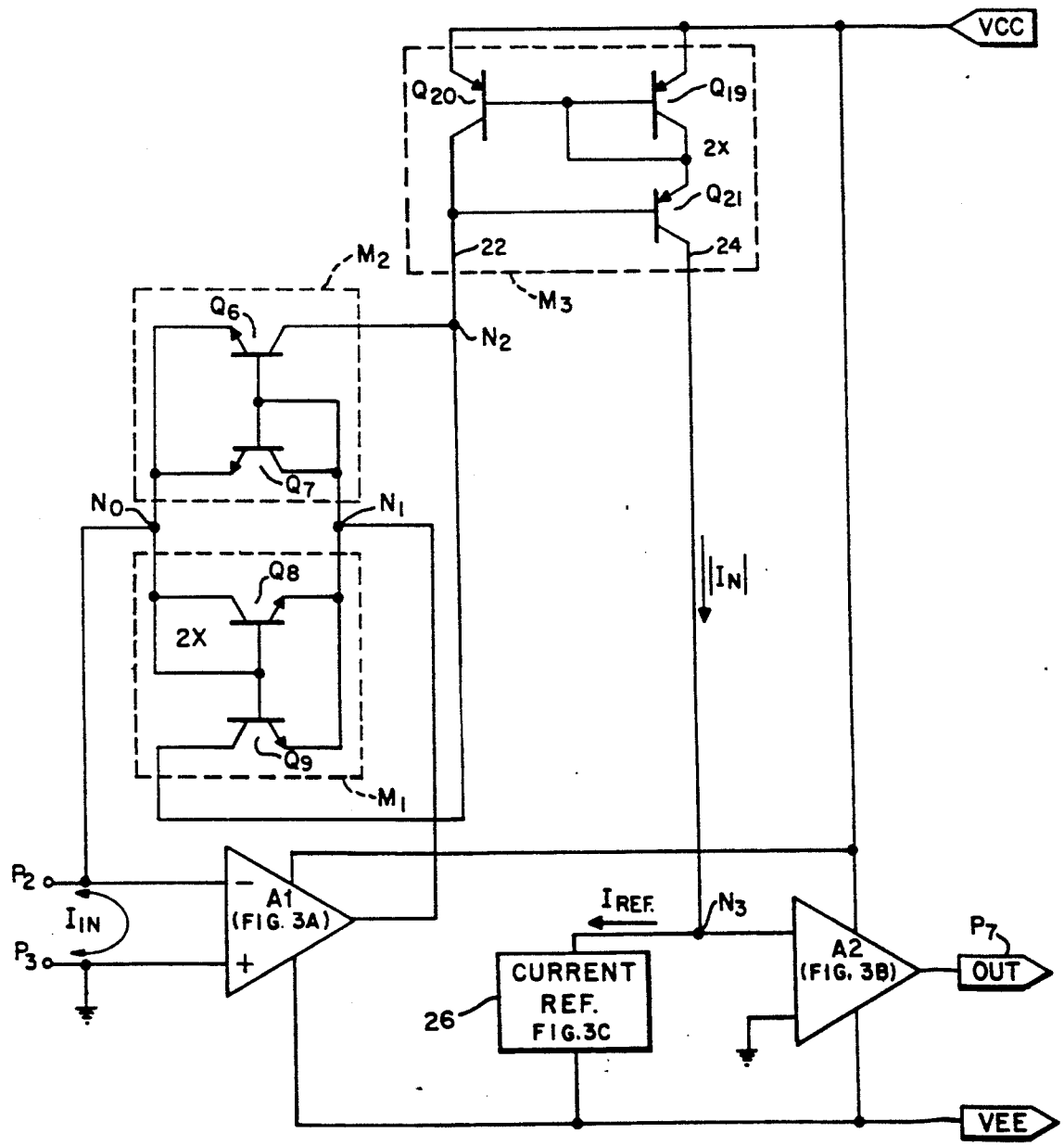
FIG. 2 is a schematic diagram, greatly simplified, of the GFI chip of FIG. 1.

Turning now to FIG. 2, the current window detector of GFI chip 18 is shown. Pins $P_2$ and $P_3$ are the inputs to amplifier $A_1$. As shown, pin $P_3$ is connected to the non-inverting amplifier terminal which is grounded or connected to a fixed voltage between $V_{CC}$ and $V_{EE}$. The output of amplifier $A_1$ is connected to the inverting terminal through a feedback loop including current mirrors $M_1$ and $M_2$. As is known from amplifier theory, amplifier $A_1$ will provide a current through current mirrors $M_1$ and $M_2$ such that pin $P_2$ is at the same voltage as pin $P_3$. One of skill in the art will appreciate that the current through the feedback loop of amplifier $A_1$ will equal the current in the secondary of transformer $T_1$ (FIG. 1).

Current mirrors $M_1$ and $M_2$ are of similar construction, each fabricated from a pair of transistors. The emitter of transistor $Q_8$ is twice the size of the emitter of transistor $Q_9$, whereas the emitters of transistors $Q_6$ and $Q_7$ are the same size.

However, current mirrors are connected in the feedback loop of amplifier $A_1$ in a "back to back" or antiparallel fashion. Thus, current from the output of amplifier $A_1$ will flow through only one of current mirrors $M_1$ and $M_2$. If amplifier $A_1$ sources current, that entire current will flow through the input current path, including transistor $Q_7$, of current mirror $M_2$. If the input has the opposite polarity and amplifier $A_1$ sinks current, the entire current will flow through the input current path, including transistor $Q_8$, of current mirror $M_1$. Therefore, the input current path of each current mirror is electrically interconnected when the alternating current of the first polarity is passed by the first current mirror and subsequently when the alternating current of the second polarity is passed by the second current mirror.

Regardless of the polarity of the input current, and regardless of which of the current mirrors $M_1$ or $M_2$ the current from amplifier $A_1$ flows through, a current will flow in the input current path, including leg 2 of current mirror $M_1$ and the output current path (including transistor $Q_9$ or $Q_6$) of the one of the current mirrors $M_1$ or $M_2$, respectively, through which the current from amplifier $A_1$ flows. The current in leg 22, will be one half the magnitude of the input current $I_{IN}$. However, the polarity will always be such as to forward bias transistor $Q_{20}$. It will be appreciated that the current is one half $I_{IN}$ because of the relative size of the emitters of $Q_8$ and $Q_9$.

The current in leg 22 is reflected into the output current path, including leg 24, of current mirror $M_3$. Here, current mirror 3 is a Wilson type current mirror with three transistors. In comparison to a simple current mirror with two transistors, $M_3$ has a higher output impedance. Transistor $Q_{19}$ is fabricated with an emitter area twice the size of the emitter area of transistor $Q_{20}$. This layout of the transistors results in the current in leg 24 being twice the current in leg 22. Since the current in leg 22 is one half $I_{IN}$, the current in leg 24 has the same magnitude as $I_{IN}$.

Thus, the current in leg 24 represents the input current at pins $P_2$ and $P_3$ rectified to have a known polarity. In the circuit of FIG. 2, the current in leg 24 therefore represents the current in the secondary of transformer $T_1$ (FIG. 1) and, if it is large enough, signals a fault. In developing the current in leg 24, current mirrors $M_1$, $M_2$, and $M_3$ rectified the input current but did not draw any current away from the path between pins $P_2$ and $P_3$. Accordingly, the path between pins $P_2$ and $P_3$ will have a very low impedance, which is important for proper operation of GFI circuit 10 (FIG. 1).

The current in leg 24 of current mirror $M_3$ is coupled to node $N_3$. Node $N_3$ is the connection between an input terminal of comparator $A_2$ and current reference 26. Current reference 26 sinks a constant current of value $I_{REF}$.

As long as the magnitude of the input current is less than $I_{REF}$, no current will flow into comparator $A_2$. The output of comparator $A_2$ will then be low. If the magnitude of the input current exceeds $I_{REF}$, current will flow into the positive terminal of comparator $A_2$. This current flow causes the output of comparator $A_2$ to go high. The output of comparator $A_2$ is indirectly coupled through a filter and latch circuit (not shown) to pin $P_7$ of GFI chip 18 (FIG. 1). Thus, when the magnitude of the input current exceeds $I_{REF}$, GFI circuit 10

(FIG. 1) disconnects power to electrical appliance 14 (FIG. 1).

Figure 3A:
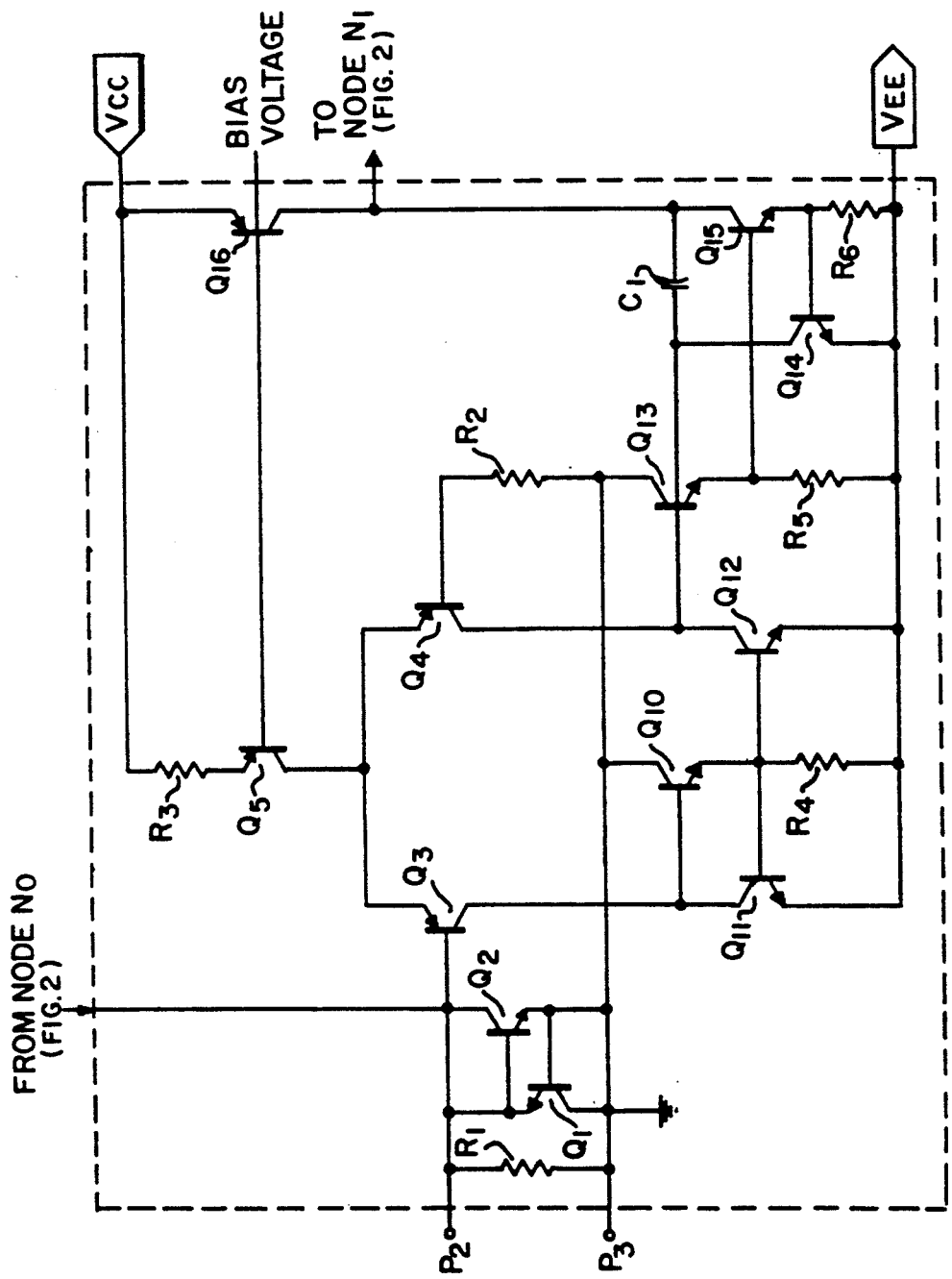
FIG. 3A is a schematic of the sense amplifier of FIG. 2.

Turning to FIG. 3A, details of amplifier $A_1$ can be seen. Amplifier $A_1$ has two stages. The first stage is a differential input stage. Transistors $Q_3$ and $Q_4$ are a standard p-n-p emitter coupled transistor pair. Resistors $R_1$ and $R_2$ are of equal value and provide a dc bias for transistors $Q_3$ and $Q_4$. Transistor $Q_5$ is biased to provide a constant current of approximately 5 $\mu$A to transistors $Q_3$ and $Q_4$. Transistors $Q_{10}$, $Q_{11}$, and $Q_{12}$ are the active load for the transistor pair $Q_3$ and $Q_4$. The active load provides a high output impedance and a large current gain.

The first stage also includes transistors $Q_1$ and $Q_2$. These transistors provide input overload current protection and may not be needed for some applications.

The second stage of amplifier $A_1$ includes transistors $Q_{13}$ and $Q_{15}$. Transistor $Q_{14}$ and resistor $R_6$ limit the current in transistor $Q_{15}$ if a large input current is applied. The current is limited to n amount, here equal to 200 $\mu$A, equal to the base to emitter voltage of $Q_{14}$ divided by $R_6$.

The output of the second stage is the output of amplifier $A_1$, which is the junction of the collectors of transistors $Q_{15}$ and $Q_{16}$. Here, $Q_{16}$ is biased to provide a constant current of 60 $\mu$A at its collector. As the input of amplifier $A_1$ increases, the current through transistor $Q_{15}$ will decrease. Thus, as the input to amplifier $A_1$ increases, more of the constant current provided by transistor $Q_{16}$ is coupled to the output of amplifier $A_1$. Conversely, as the input decreases, less current is coupled to the output of amplifier $A_1$.

FIG. 3A shows three voltage levels $V_{CC}$, $V_{EE}$, and a bias voltage. These voltage levels are generated by a portion (not shown) of GFI chip 18. As shown in FIG. 1, pins $P_5$ and $P_6$ are connected through $R_{LINE}$ across the wires of power cord 12, which carries AC voltage. This voltage can be rectified and level shifted with known circuitry to provide the desired voltages. For example, $V_{CC}$ is typically six volts. $V_{EE}$ is typically ground, and the bias voltage is typically six volts minus the voltage drop across the base/emitter junction of a transistor.

Figure 3C:
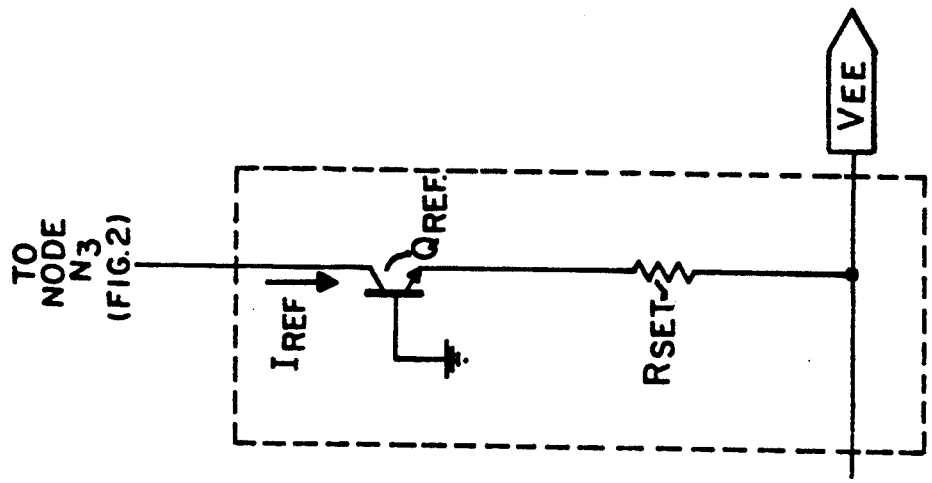
FIG. 3C is a schematic of the current reference circuit of FIG. 2.
Figure 3B:
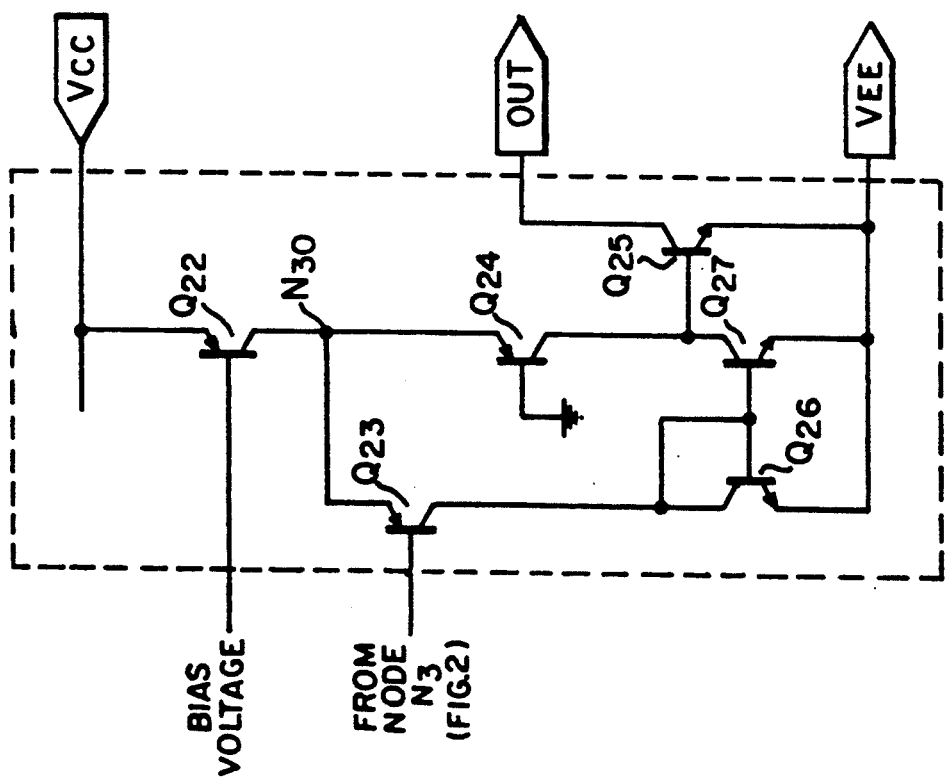
FIG. 3B is a schematic of the comparator of FIG. 2.

Turning to FIG. 3B, additional details of comparator $A_2$ can be seen. Transistor $Q_{22}$ establishes a current into node $N_{30}$. As long as $I_{REF}$ exceeds the current at pin $P_2$, base current flows in transistor $Q_{23}$. Transistor $Q_{23}$ turns on and transistor $Q_{24}$ turns off, causing transistors $Q_{26}$ and $Q_{27}$ to be on and $Q_{25}$ to be off. If, however, current flows from node $N_3$ into the base of $Q_{23}$, as when the input current exceeds $I_{REF}$, no current will flow through $Q_{26}$ and $Q_{27}$. The current from $Q_{22}$ will then flow into the base of $Q_{25}$, turning transistor $Q_{25}$ on. The point labeled OUT will thus take on a voltage almost equal to ground, indicating a current in excess of $I_{REF}$ was measured. The point labeled OUT is indirectly coupled to silicon controlled rectifier SCR (FIG. 1) causing it to be triggered when the input current exceeds $I_{REF}$.

Turning to FIG. 3C, details of current reference 26 are seen. Here, a simple current reference which uses a resistor $R_{SET}$ and a transistor $Q_{REF}$ is used. Here, the resistor $R_{SET}$ is external to GFI chip 18 as shown in FIG. 1.

Figure 4:
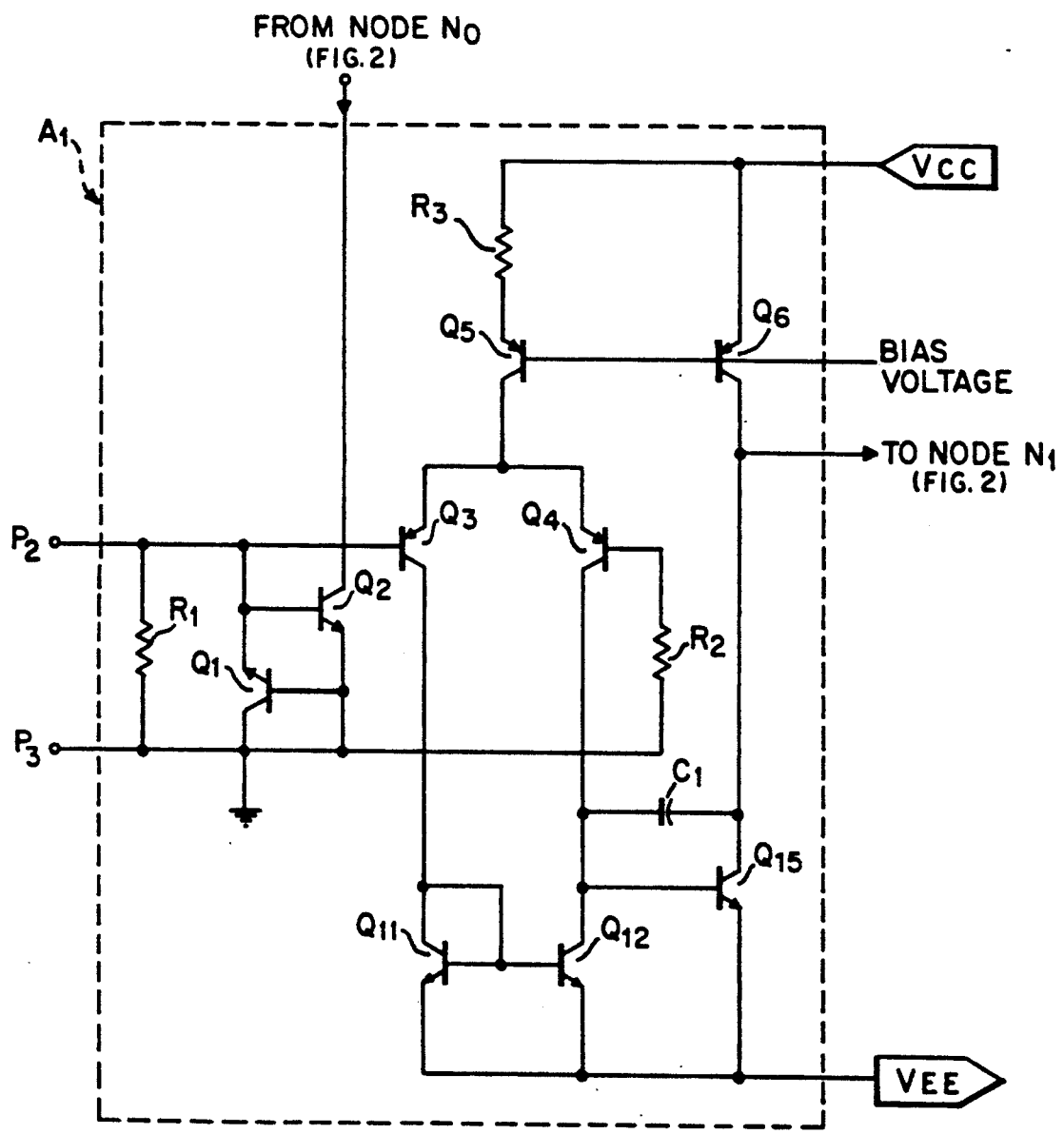
FIG. 4 is a simplified schematic of an alternative embodiment of the sense amplifier of FIG. 2.

Turning to FIG. 4, an alternative circuit for amplifier $A_1$ is shown. The embodiment of FIG. 4 can operate with a voltage difference between $V_{CC}$ and $V_{EE}$ less than three volts. Removing transistors $Q_{10}$, $Q_{13}$, and $Q_{14}$ (FIG. 3A) allows amplifier to operate with a bias voltage as low as 1 volt. The configuration of FIG. 4 has an increased offset voltage, typically 1 millivolt, and lower open loop voltage gain than the circuit of FIG. 3A. However, sometimes it may be desirable to have the circuit operate at very low voltages.

Figure 5:
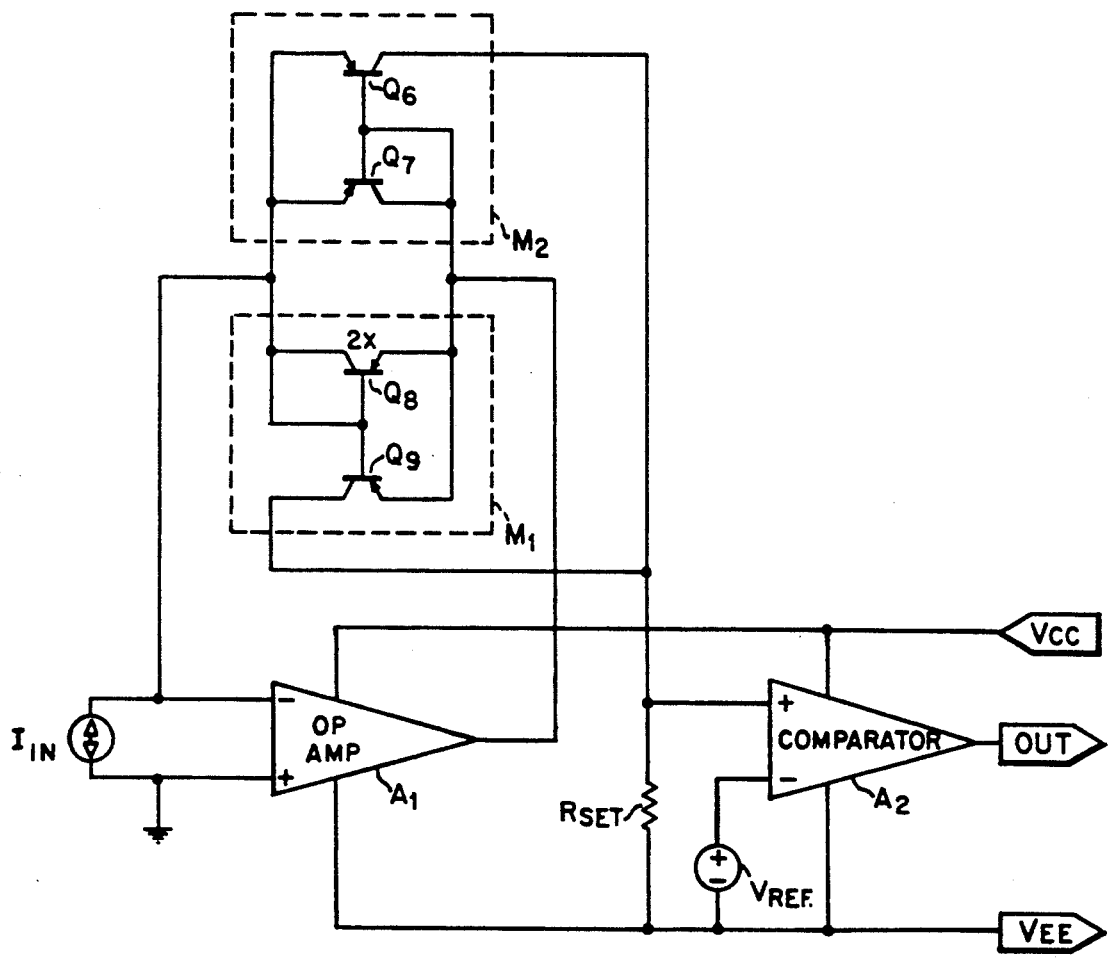
FIG. 5 is a simplified schematic of an alternative embodiment of GFI chip of FIG. 1.

Having disclosed embodiments of this invention, various alternative embodiments will be apparent to one of skill in the art. For example, current mirror $M_3$ (FIG. 2) is a Wilson type current mirror. This type of current mirror has a better output impedance than a basic two transistor current mirror. The improved output impedance provides more accuracy in matching the current in leg 24 (FIG. 2) to the current at pin $P_2$. If high accuracy is not required, current mirror $M_3$ could even be eliminated entirely. A circuit without current mirror $M_3$ is shown in FIG. 5. In the circuit of FIG. 5, a voltage source $V_{REF}$ is used to establish the threshold at which the current window detector indicates an input current exceeding a threshold. Here, $V_{REF}$ is selected to be one half $R_{SET}$ times the current threshold. It is felt, therefore, that this invention should be limited only by the spirit and scope of the appended claims.

What is claimed is:

1. A ground fault interrupt circuit comprising:
   a) an amplifier having an inverting input and a noninverting input and an output;
   b) a first current mirror having an input current path and an output current path, the input current path being connected between the output of the amplifier and the inverting input of the amplifier;
   c) a second current mirror having an input current path and an output current path, the input current path being connected between the output of the amplifier and the inverting input of the amplifier;
   d) a third current mirror having an input current path and an output current path, the input current path being connected to the output current path of the first current mirror and the output current path of the second current mirror; and
   e) means for comparing current in the output current path of the third current mirror to a reference current and for providing, at an output of the ground fault interrupt circuit, a ground fault detection signal in response to said comparison.

2. The ground fault interrupt circuit of claim 1 wherein the input current path of the first current mirror passes current of a first polarity and the input current path of the second current mirror passes current of a second polarity.

3. The ground fault interrupt circuit of claim 1 including a comparator and wherein a connection between the third current mirror and the reference current is coupled to the output of said ground fault interrupt circuit through the comparator.

4. The ground fault interrupt circuit of claim 3 further comprising means for providing the reference current comprising:
   a) a resistor; and
   b) a transistor connected in series with the resistor.

5. The ground fault interrupt circuit of claim 4 wherein said circuit is disposed in a power cord, said power cord being adapted for coupling to an electrical appliance.

6. A circuit comprising:
   a) means for rectifying an alternating current having a first polarity or a second polarity to provide a corresponding rectified current, said rectifying means comprising: a pair of current mirrors, each of said current mirrors having an input current path and an output current path, with the output current path of each current mirror being coupled to a common circuit node, the input current path of the first current mirror passing the alternating current of the first polarity and the input current path of the second current mirror passing the alternating current of the second polarity; and b) means, coupled to the circuit node, for producing an output signal indicating a change in the level of the alternating current of the first polarity passing through the first current mirror and a change in the alternating current of the second polarity passing through the second current mirror.

7. The circuit of claim 6 wherein the means for producing an output signal comprises:
   a) circuit means for producing an output signal when a current is applied to its input; and
   b) means for diverting current up to the predetermined threshold amount away from the input of the circuit means.

8. A circuit comprising:

a) means for rectifying an alternating current having a first polarity or a second polarity to provide a corresponding rectified current, said rectifying means comprising: a pair of current mirrors, each of said current mirrors having an input current path and an output current path, with the output current path of each current mirror being coupled to a common circuit node, the input current path of the first current mirror passing the alternating current of the first polarity and the input current path of the second current mirror passing the alternating current of the second polarity, said input current path of each current mirror being electrically interconnected when the alternating current of the first polarity is passed by the first current mirror and subsequently when the alternating current of the second polarity is passed by the second current mirror; and b) means, coupled to the circuit node, for producing an output signal in response to the corresponding rectified current exceeding a predetermined threshold.

* * * * *